(12) United States Patent
Kim et al.

(10) Patent No.: US 9,761,348 B2
(45) Date of Patent: Sep. 12, 2017

(54) CONDUCTIVE PASTE USED FOR SOLAR CELL ELECTRODES

(71) Applicant: E I DU PONT DE NEMOURS AND COMPANY, Wilmington, DE (US)

(72) Inventors: Esther Kim, Cary, NC (US); Brian J Laughlin, Apex, NC (US); Kurt Richard Mikeska, Hockessin, DE (US); Yusuke Tachibana, Kanagawa (JP); Paul Douglas Vernooy, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 246 days.

(21) Appl. No.: 14/202,073

(22) Filed: Mar. 10, 2014

(65) Prior Publication Data
US 2015/0255185 A1    Sep. 10, 2015

(51) Int. Cl.
| | |
|---|---|
| *H01B 1/22* | (2006.01) |
| *H01L 31/0224* | (2006.01) |
| *H01L 31/0264* | (2006.01) |
| *C03C 8/10* | (2006.01) |
| *B22F 1/00* | (2006.01) |
| *H01L 31/0216* | (2014.01) |
| *H01B 1/08* | (2006.01) |
| *C03C 8/12* | (2006.01) |

(52) U.S. Cl.
CPC .......... *H01B 1/22* (2013.01); *B22F 1/0059* (2013.01); *C03C 8/10* (2013.01); *C03C 8/12* (2013.01); *H01B 1/08* (2013.01); *H01L 31/02167* (2013.01); *H01L 31/022425* (2013.01); *H01L 2251/303* (2013.01)

(58) Field of Classification Search
None
See application file for complete search history.

(56) References Cited

U.S. PATENT DOCUMENTS

| | | | |
|---|---|---|---|
| 8,486,308 | B2 | 7/2013 | Ittel et al. |
| 2011/0308597 | A1 | 12/2011 | Carroll et al. |
| 2012/0085404 | A1* | 4/2012 | Yamanaka ................ C03C 8/04 136/256 |
| 2012/0313198 | A1 | 12/2012 | Ittel et al. |
| 2013/0000714 | A1 | 1/2013 | Ittel et al. |
| 2013/0043440 | A1 | 2/2013 | Vernooy et al. |

* cited by examiner

*Primary Examiner* — Katie L Hammer (57) ABSTRACT

The present invention is directed to a conductive paste used for solar cell electrodes comprising, (i) 60 wt % to 95 wt % of a conductive powder, based on the total weight of the conductive paste, (ii) 0.1 wt % to 10 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder, (iii) 3 wt % to 38 wt % of an organic medium, based on the total weight of the conductive paste, and (iv) 0.01 wt % to 5.0 wt % of lithium oxide powder selected from the group consisting of $LiMnO_3$, $Li_2WO_4$, $Li_2CO_3$, $Li_2TiO_3$, $Li_4Ti_5O_{12}$, $Li_2MoO_4$ and a mixture thereof, based on the total weight of the conductive paste.

8 Claims, 3 Drawing Sheets

CONDUCTIVE PASTE USED FOR SOLAR CELL ELECTRODES

FIELD OF THE INVENTION

The invention relates to a conductive paste to form solar cell electrodes.

TECHNICAL BACKGROUND OF THE INVENTION

Most solar cells are in the form of a silicon substrate that has been metallized, i.e., provided with metal electrodes that are electrically conductive.

The electrodes of silicon solar cells are generally formed by printing a paste onto a silicon substrate. US-2011-0308597 A1 discloses a thick-film paste comprising a lead-tellurium-oxide powder for forming solar cell electrodes.

After printing, the substrate and the paste are fired in air to form a dense solid of electrically conductive traces. In the firing step, the glass frit can provide adhesion to the substrate and aid in the adhesion of subsequently soldered leads to the electrode. Good adhesion to the substrate and high solder adhesion of the leads to the electrode are desired for better performance of the solar cell as well as the manufacturability and reliability of the solar modules, especially when a lead-tellurium-oxide powder is contained in the paste.

SUMMARY OF THE INVENTION

In one aspect, the present invention relates to a conductive paste used for a solar cell electrode comprising, (i) 60 wt % to 95 wt % of a conductive powder, based on the total weight of the conductive paste, (ii) 0.1 wt % to 10 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder, (iii) 3 wt % to 38 wt % of an organic medium, based on the total weight of the conductive paste, (iv) 0.01 wt % to 5.0 wt % of lithium oxide powder selected from the group consisting of $LiMnO_3$, $Li_2WO_4$, $Li_2CO_3$, $Li_2TiO_3$, $Li_4Ti_5O_{12}$, $Li_2MoO_4$ and a mixture thereof, based on the total weight of the conductive paste.

DETAILED DESCRIPTION OF THE INVENTION

Conductive Paste

In an embodiment, the conductive paste used for solar cell electrodes comprises a conductive powder, a lead-tellurium-oxide powder, an organic medium and a specific lithium oxide powder.

(i) Conductive Powder

The conductive powder is any powder that enables to transport electrical current. In an embodiment, the conductive powder is a conductive metal powder selected from the group consisting of iron (Fe), aluminum (Al), nickel (Ni), copper (Cu), silver (Ag), gold (Au), palladium (Pd) and a mixture thereof. The conductive metal powder can comprise Ag powder, Al powder or a mixture thereof in another embodiment.

Using such conductive metal powder with high electrical conductivity, electrical property of the electrode can be improved. The conductive metal power to form the front-side electrode comprises at least silver powder, in an embodiment. In an embodiment, the silver powder is in a flake form, a spherical form, a granular form, a crystalline form, other irregular form or mixtures thereof.

The mean particle size (D50) of the conductive powder can be 0.1 µm to 10 µm in an embodiment, 0.5 to 8 µm in another embodiment, and 1 µm to 5 µm in still further embodiment. The silver powder with such particle diameter can be adequately dispersed in the organic binder and solvent, and smoothly applied by printing.

The amount of conductive powder in the conductive paste is 60 wt % to 95 wt % in an embodiment, 65 wt % to 92 wt % in another embodiment, 70 wt % to 90 wt % in further embodiment, based on the total weight of the conductive paste, in view of conductivity. The conductive paste including the conductive powder within the above ranges can form, with satisfactory printability, an electrode pattern with a small line width.

The conductive powder can be coated or not coated with organic materials such as surfactant and phosphorous-containing compounds. In an embodiment, the conductive powder can be coated with a surfactant, particularly when the conductive powder is too finely divided to disperse well in the organic medium. Suitable surfactants include polyethyleneoxide, polyethyleneglycol, benzotriazole, poly(ethyleneglycol) acetic acid, lauric acid, oleic acid, capric acid, myristic acid, linolic acid, stearic acid, palmitic acid, stearate salts, palmitate salts, and mixtures thereof.

(ii) Lead-Tellurium-Oxide Powder

The lead-tellurium-oxide powder is defined as a lead-tellurium-oxide powder which does not comprise more than 50 wt % of $Bi_2O_3$, based on the total weight of the lead-tellurium-oxide powder. In an embodiment, the content of $Bi_2O_3$ based on the total weight of the lead-tellurium-oxide powder is less than 40 wt %, less than 30 wt % in another embodiment.

In an embodiment, the lead-tellurium-oxide powder comprises 20 wt % to 60 wt % of PbO, 25 wt % to 55 wt % of PbO in another embodiment, 30 wt % to 50 wt % of PbO in further embodiment, based on the total weight of the lead-tellurium-oxide powder. In an embodiment, the lead-tellurium-oxide powder comprises 20 wt % to 60 wt % of $TeO_2$, 30 wt % to 60 wt % of $TeO_2$ in another embodiment, 35 wt % to 58 wt % of $TeO_2$ in further embodiment, based on the total weight of the lead-tellurium-oxide powder. The softening point of the lead-tellurium-oxide powder comprising the above component within the above ranges can be effectively kept low, resulting in a solar cell with high electrical characteristics.

In an embodiment, the lead-tellurium-oxide powder is in eutectic phase. In another embodiment, the lead-tellurium-oxide powder is in amorphous phase. In this disclosure, "eutectic" is a mixture of chemical compounds or elements that have a single chemical composition that solidifies at a lower temperature than any other composition made up of the same ingredients. In this disclosure, "amorphous" is the one which lacks the long-range order characteristic of a crystal.

In an embodiment, the lead-tellurium-oxide powder may also contain additional components such as silicon, silver, tin, bismuth, aluminum, titanium, copper, lithium, cerium, zirconium, sodium, vanadium, zinc, fluorine.

In an embodiment, the lead-tellurium-oxide powder is a lead-tellurium-lithium-oxide powder.

The lead-tellurium-oxide powder may be prepared by mixing PbO, $TeO_2$ and other materials that decompose into the oxides when heated using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium and other materials oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. In an embodiment, the milled powder has a D50 of 0.1 to 3.0 microns. One skilled in the art may employ alternative synthesis techniques such as but not limited to water quenching, sol-gel, spray pyrolysis, and so on.

In an embodiment, the starting mixture used to make the lead-tellurium-oxide powder may include (based on the weight of the total starting mixture): PbO that may be 20 wt % to 60 wt %, 25 to 55 wt %, or 30 to 50 wt %; and $TeO_2$ that may be 20 wt % to 60 wt %, 30-60 wt %, or 35 to 58 wt %.

In a further embodiment, in addition to the above PbO, and $TeO_2$, the starting mixture used to make the lead-tellurium-lithium-oxide powder may include one or more of $Li_2O$, $SiO_2$, $SnO_2$, $B_2O_3$, $Ag_2O$, $BiF_3$, $V_2O_5$, $Na_2O$, $ZrO_2$, $CeO_2$, $Bi_2O_3$, $Nb_2O_5$, $Ta_2O_5$, $K_2O$, MgO, $P_2O_5$, $SeO_2$, $CO_3O_4$, PdO, $RuO_2$, NiO, MnO, $Cr_2O_3$, or $Al_2O_3$. In aspects of this embodiment (based on the weight of the total starting mixture): the $Li_2O$ may be 0.1 to 5 wt %, 0.2 to 3 wt %, or 0.3 to 1 wt %; the $SiO_2$ may be 0 to 11 wt %, 0 to 5 wt %, 0.25 to 4 wt %, or 0 to 0.5 wt %; the $SnO_2$ may be 0 to 5 wt %, 0 to 2 wt %, or 0.5 to 1.5 wt %; the $B_2O_3$ may be 0 to 10 wt %, 0 to 5 wt %, or 0.5 to 5 wt %; the $Ag_2O$ may be 0 to 30 wt %, 0 to 20 wt %, 3 to 15 wt % or 1 to 8 wt %; the $TiO_2$ may be 0 to 5 wt %, 0.25 to 5 wt %, or 0.25 to 2.5 wt %; the $PbF_2$ may be 0 to 20 wt %, 0 to 15 wt %, or 5 to 10 wt %; the $BiF_3$ may be 0 to 15 wt %, 0 to 10 wt %, or 1 to 10 wt %; the ZnO may be 0 to 5 wt %, 0 to 3 wt %, or 2 to 3 wt %; the $V_2O$ may be 0 to 5 wt %, 0 to 1 Wt %, or 0.5 to 1 wt %; the $Na_2O$ may be 0 to 5 wt %, 0 to 3 wt %, or 0.1 to 1.5 wt %; the CuO may be 0 to 5 wt %, 0 to 3 wt %, or 2 to 3 wt %; the $ZrO_2$ may be 0 to 3 wt %, 0 to 2 wt %, or 0.1 to 1 wt %; the $CeO_2$ may be 0 to 5 wt %, 0 to 3 wt %, or 0.1 to 2.5 wt %; the $Bi_2O_3$ may be 0 to 15 wt %, 0 to 10 wt %, or 5 to 8 wt %; and the $Al_2O_3$ may be 0 to 3 wt %, 0 to 2 wt %, or 0.1 to 2 wt %.

In an embodiment, the lead-tellurium-oxide powder may be a homogenous powder. In a further embodiment, the lead-tellurium-oxide powder may be a combination of more than one powder, wherein each powder may separately be a homogenous population. The composition of the overall combination of the two powders may be within the ranges described above. For example, the lead-tellurium-lithium-oxide powder may include a combination of two or more different powders; separately, these powders may have different compositions, and may or may not be within the ranges described above; however, the combination of these powders may be within the ranges described above.

In an embodiment, the amount of the lead-tellurium-oxide powder in the conductive paste is 0.1 wt % to 10 wt %, 0.3 wt % to 5 wt % in another embodiment, 1.0 wt % to 3.0 wt % in further embodiment, based on the total weight of the conductive paste, in view of obtaining an improved electrical performance.

One of ordinary skill in the art would recognize that the choice of raw materials could unintentionally include impurities that may be incorporated into the lead-tellurium-lithium-oxide powder during processing. For example, the impurities may be present in the range of hundreds to thousands ppm. The presence of the impurities would not alter the properties of the glass, the thick film composition, or the fired device. For example, a solar cell containing the thick-film composition may have the efficiency described herein, even if the thick-film composition includes impurities.

(iii) Organic Medium

The inorganic components of the conductive paste are mixed with an organic medium to form viscous thick-film pastes or less viscous inks having suitable consistency and rheology for printing. A wide variety of inert viscous materials can be used as the organic medium. The organic medium can be one in which the inorganic components are dispersible with an adequate degree of stability during manufacturing, shipping and storage of the pastes or inks, as well as on the printing screen during a screen-printing process.

In an embodiment, the organic medium have rheological properties that provide stable dispersion of solids, appropriate viscosity and thixotropy for printing, appropriate wettability of the substrate and the paste solids, a good drying rate, and good firing properties.

In an embodiment, the organic medium can contain thickeners, stabilizers, surfactants, and/or other common additives. One such thixotropic thickener is Thixatrol® (Elementis plc, London, UK).

In an embodiment, the organic medium can be a solution of polymer(s) in organic solvent(s). In an embodiment, the polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. In an embodiment, the organic solvents include texanol, terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy) ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin.

In an embodiment, the organic medium comprises volatile liquids to promote rapid hardening after application of the paste composition on a substrate.

The optimal amount of organic medium in the conductive paste is dependent on the method of applying the composition and the specific organic medium used. The instant conductive paste contains 3 to 38 wt % of organic medium in an embodiment, based on the total weight of the conductive paste.

If the organic medium comprises a polymer, the polymer comprises 8 to 15 wt % of the organic composition in an embodiment.

(iv) Lithium Oxide Powder

In an embodiment, the conductive paste comprises a lithium oxide powder selected from the group consisting of $LiMnO_3$, $Li_2WO_4$, $Li_2CO_3$, $Li_2TiO_3$, $Li_4Ti_5O_{12}$, $Li_2MoO_4$ and a mixture thereof, based on the total weight of the conductive paste. In an embodiment, the lithium oxide powder may be accompanied by other additional components, such as unreacted materials. For example, $Li_2MnO_3$ powder may be accompanied by at least one of $Li_2CO_3$ and $MnO_2$. $Li_2WO_4$ powder may be accompanied by at least one of $Li_2CO_3$ and $WO_3$. Both $Li_2TiO_3$ and $Li_4Ti_5O_{12}$ powder may be accompanied by at least one of $Li_2CO_3$ and $Ti_2O$. $Li_2MoO_4$ powder may be accompanied by at least one of $Li_2CO_3$ and $MoO_3$.

The purity of the lithium oxide powder can be no less than 95 wt % based on the total weight of the powder in an embodiment. In this case, the lithium oxide powder can contain less than 5 wt % of e.g. unreacted materials based on the total weight of the powder. In another embodiment, the purity of lithium oxide powder can be no less than 97 wt % based on the total weight of the powder in another embodiment. In this case, the lithium oxide powder can contain less than 3 wt % of e.g. unreacted materials based on the total weight of the powder.

In an embodiment, the shape of the lithium oxide powder is flakes, spherical-shaped, nodular-shaped (irregular-shaped) or any combinations thereof. In an embodiment, the mean particle size (D50) of the lithium oxide powder can be 0.1 μm to 5.0 μm in an embodiment, 0.3 μm to 1.4 μm in another embodiment, and 0.7 μm to 1.2 μm in further embodiment. The lithium oxide powders within the above mean particle ranges can effectively improve the adhesion of electrodes while keeping good photoelectric conversion efficiency (Eff (%)) of the solar cell.

In an embodiment, the specific surface area (SPA) of the lithium oxide powder can be in the range of 10000 to 150000 $cm^2/cm^3$. In another embodiment, the SPA of the lithium oxide powder can be 20000 to 100000 $cm^2/cm^3$. In still further embodiment, SPA of the lithium oxide powder can be 30000 to 80000 $cm^2/cm^3$. The lithium oxide powders having the SPA inside the above ranges can effectively improve the adhesion of electrodes while keeping low contact resistance between electrode and silicon substrate.

In the disclosure, the specific surface area (SPA) can be measured, for example, by a Laser Diffraction Device (e.g. Horiba LA-910) which determines particle size. A few drops of the IPA (isopropyl alcohol) slurry are taken from the milling process and then put into the Horiba's reservoir (which is filled with either water or IPA, depending on the solubility of the material). The liquid in the reservoir is pumped through the cell and the laser shines through it. The detector measures the intensity of the scattered light at various angles, and from that, a particle size distribution is calculated.

In an embodiment, the conductive paste comprises 0.01 wt % to 5.0 wt % of the lithium oxide powder, wherein the wt % are based on the total weight of the conductive paste. In another embodiment, the conductive paste comprises 0.03 wt % to 1.0 wt %, of the lithium oxide powder. In further embodiment, the conductive paste comprises 0.05 wt % to 0.2 wt % of the lithium oxide powder. The lithium oxide powder within the range can effectively improve the adhesion of electrodes while keeping good photoelectric conversion efficiency (Eff (%)) of the solar cell.

(v) Bismuth-Based Glass Frit.

In an embodiment, the conductive paste used for solar cell electrodes further comprises a bismuth-based glass frit comprising no less than 50 wt % of $Bi_2O_3$, based on the total weight of the glass frit, and therefore the bismuth-based glass frit of component (v) does not fall in the definition of the aforementioned lead-tellurium-oxide powder (component (ii)), which does not comprise more than 50 wt % of $Bi_2O_3$, based on the total weight of the powder. The conductive paste containing the bismuth-based glass frit can show better adhesion.

In an embodiment, the conductive paste comprises 0.01 wt % to 1.0 wt % of the bismuth-based glass frit, wherein the wt % are based on the total weight of the conductive paste. In another embodiment, the conductive paste comprises 0.02 wt % to 0.8 wt % of the bismuth-based glass frit. The conductive paste containing the bismuth-based glass frit within the ranges can show better adhesion of electrodes while keeping good photoelectric conversion efficiency (Eff (%)) of the solar cell.

In an embodiment, the bismuth-based glass fit further comprises ZnO, $B_2O_3$ in addition to $Bi_2O_3$ or a mixture thereof. In an embodiment, the bismuth-based glass frit comprises 2.5 wt % to 20 wt % of $B_2O_3$, 55 wt % to 90 wt % of $Bi_2O_3$, 8.0 wt % to 20 wt % of ZnO, based on the total weight of the bismuth-based glass frit. The glass frit containing the above described components can show better adhesion of electrodes while keeping good photoelectric conversion efficiency (Eff (%)) of the solar cell.

In an embodiment, the mean particle size (D50) of the bismuth-based glass frit can be 0.2 μm to 2.0 μm in an embodiment, 0.6 μm to 1.1 μm in another embodiment. The bismuth-based glass frit within the mean particle range can effectively improve the adhesion of electrodes while keeping good photoelectric conversion efficiency (Eff (%)) of the obtained solar cell.

(vi) Additives

As additives, in an embodiment, the conductive paste can comprise a metal resinate, such as lead resinate, barium resinate, calcium resinate, bismuth resinate, manganese resinate and a mixture thereof from the view point of good adhesion properties.

The content of the metal resinate in the conductive paste is not limited, but in an embodiment, 0-2 wt %, based on the total conductive paste.

In another embodiment, the conductive paste can comprise a metal oxide, such as cobalt(II) oxide, zinc oxide, magnesium oxide, chromium oxide, copper (II) oxide, Iron (III) oxide and a mixture thereof from the view point of good adhesion properties. The content of the metal oxide in the conductive paste is not limited, but in an embodiment, 0-2 wt %, based on the total conductive paste.

Multiple types of additives can be used. Type and amount of the additives can be chosen by people in the industry, in view of desired characteristics such as preservation stability, printability, or resulting electrical property.

(vii) Physical Properties of Conductive Paste

Viscosity

The viscosity of the conductive paste is 200-500 Pa·s, in an embodiment, 250-400 Pa·s in another embodiment from a viewpoint of printability. In the present invention, the viscosity of the conductive paste is a value obtained by measurement at 25° C., 10 rpm using a Brookfield HBT viscometer with a #14 spindle and a utility cup.

Inorganic Solids

The inorganic solids content of the conductive paste is calculated as the percentage (wt %) of inorganic solids relative to the total weight of the conductive paste. The inorganic solids comprise conductive powder, lead-tellurium-oxide powder, and lithium oxide powder in an embodiment.

In an embodiment, the inorganic solids content is 62 wt % to 97 wt %. In another embodiment, it is 85 wt % to 96 wt %. The conductive paste containing the inorganic solids within the above ranges can form, with satisfactory printability, an electrode pattern with a fine line width can be obtained.

Preparation of the Conductive Paste

In an embodiment, the conductive paste can be prepared by mixing the above-mentioned conductive powder, lead-tellurium-oxide powder, organic medium, lithium oxide powder and so on. In some embodiments, the inorganic materials are mixed first, and they are then added to the organic medium. In other embodiments, an electrically conductive metal which is the major portion of the inorganics is slowly added to the organic medium. The viscosity can be adjusted, if needed, by the addition of solvents. Mixing methods that provide high shear are useful to disperse the particles in the medium.

Formation of Solar Cell Electrodes

The conductive paste can be deposited, for example, by screen-printing, stencil-printing, plating, extrusion, ink-jet printing, shaped or multiple printing, or ribbons.

In this electrode-forming process, the conductive paste is first dried and then heated to remove the organic medium and sinter the inorganic materials in an embodiment. The heating can be carried out in air or an oxygen-containing atmosphere in an embodiment. This step is commonly referred to as "firing." The firing temperature profile is typically set so as to enable the burnout of organic binder materials from the dried paste composition, as well as any other organic materials present. In an embodiment, the firing temperature is 700 to 950° C. The firing can be conducted in a belt furnace using high transport rates, for example, 100-600 cm/min, with resulting hold-up times of 0.03 to 5 minutes. Multiple temperature zones can be used to control the desired thermal profile.

In an embodiment, a semiconductor device is manufactured from an article comprising a junction-bearing semiconductor substrate and a silicon nitride insulating film formed on a main surface thereof. The instant conductive paste is applied (e.g., coated or screen-printed) onto the insulating film, in a predetermined shape and thickness and at a predetermined position. The instant conductive paste has the ability to penetrate the insulating layer, either partially or fully. Firing is then carried out and the paste reacts with the insulating film and penetrates the insulating film, thereby effecting electrical contact with the silicon substrate and as a result the electrode is formed.

An example of this method of forming the electrode is described below in conjunction with FIG. 1. However, the scope of the invention is not limited to the below specific embodiments.

Figure 1:
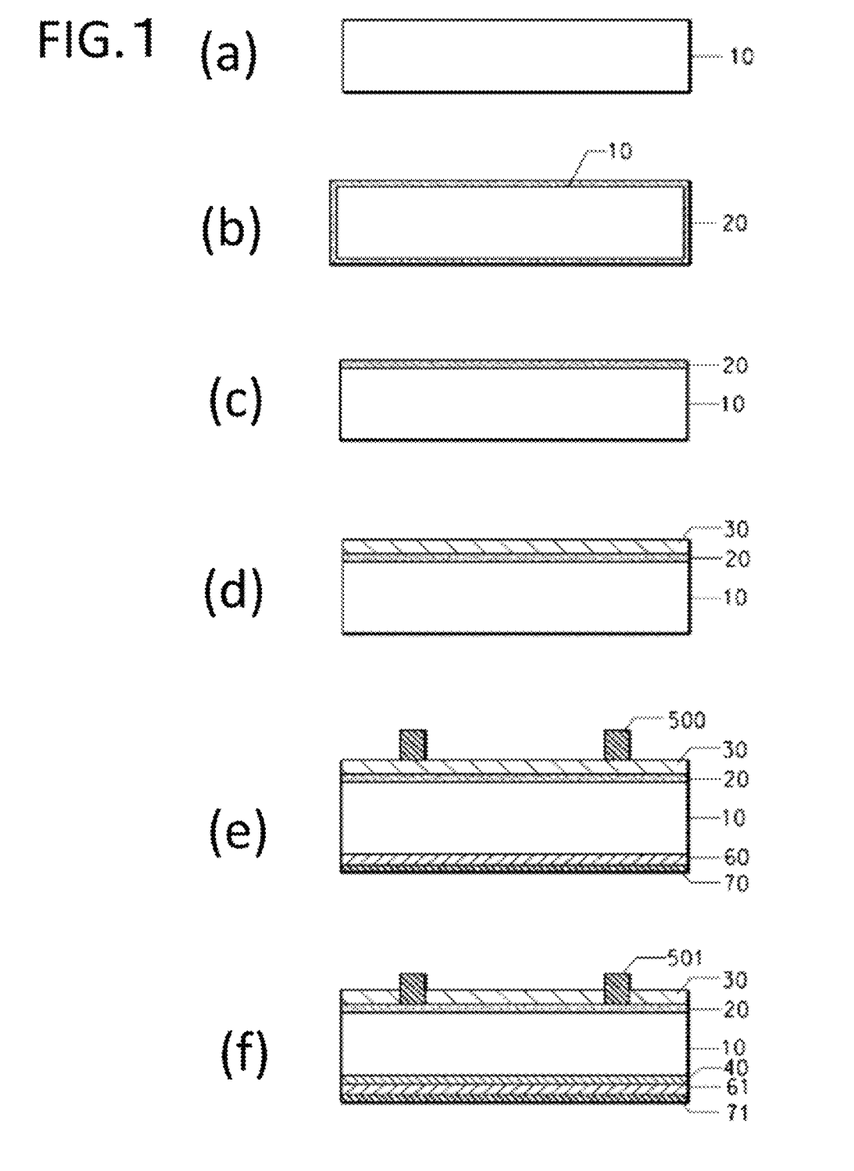
FIG. 1 shows a process flow diagram illustrating the fabrication of a solar cell.

A single crystal or multi-crystalline p-type silicon substrate 10 is provided (cf. FIG. 1(a)). An n-type diffusion layer 20 of the reverse conductivity type is formed by the thermal diffusion of phosphorus using phosphorus oxychloride as the phosphorus source (FIG. 1(b)). In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

After protecting the front surface of this diffusion layer with a resist or the like, the diffusion layer 20 is removed from the rest of the surfaces by etching so that it remains only on the front surface (FIG. 1(c)). The resist is then removed using an organic solvent or the like.

Then, an insulating layer 30 which also functions as an anti-reflection coating (ARC) is formed on the n-type diffusion layer 20 (FIG. 1(d)). The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 angstrom of a silicon nitride film is suitable for a refractive index of about 1.9 to 2.0. Deposition of the insulating layer 30 can be by sputtering, chemical vapor deposition, or other methods.

Next, electrodes are formed. The conductive paste of the present invention 500 is screen-printed to create the front electrode on the insulating film 30 and then dried (FIG. 1(e)). In addition, a back-side silver or silver/aluminum paste 70, and an aluminum paste 60 are then screen-printed onto the back side of the substrate and successively dried. Firing is carried out in an infrared belt furnace at a temperature range of approximately 700 to 950° C. for a period of from several seconds to several tens of minutes.

Consequently, during firing, aluminum diffuses from the aluminum paste 60 into the silicon substrate 10 on the back side thereby forming a p+ layer 40 containing a high concentration of aluminum dopant (FIG. 1(f)). This layer is generally called the back surface field (BSF) layer, and helps to improve the energy conversion efficiency of the solar cell.

Firing converts the dried aluminum paste 60 to an aluminum back electrode 61. The back-side silver or silver/aluminum paste 70 is fired at the same time, becoming a silver or silver/aluminum back electrode 71. During firing, the boundary between the back-side aluminum and the back side silver or silver/aluminum assumes the state of an alloy, thereby achieving electrical connection. Most areas of the back electrode are occupied by the aluminum electrode 61, owing in part to the need to form a p+ layer 40. Because soldering to an aluminum electrode is difficult, the silver or silver/aluminum back electrode 71 is formed over portions of the back side as an electrode for interconnecting solar cells by means of copper ribbon or the like. In addition, the front side conductive paste 500 sinters and penetrates through the insulating film 30 during firing, and thereby achieves electrical contact with the n-type layer 20. This type of process is generally called "fire through." The fired electrode 501 of FIG. 1(f) shows the result of the fire through.

conductive pastes. When well mixed, the conductive pastes were repeatedly passed through a 3-roll mill for at progressively increasing pressures from 0 to 400 psi. and the gap of the rolls was adjusted to 1 mil. The degree of dispersion was measured by fineness of grind (FOG). A typical FOG value was generally equal to or less than 20/10 for a conductor. The content (wt %) of each component in each conductive paste are shown in Table 1. The degree of dispersion was measured by fineness of grind (FOG).

TABLE 1

| Paste composition | i) Ag powder (wt %) | ii) Lead-tellurium-oxide powder (wt %) | iii) Organic medium (wt %) | iv) lithium oxides powder (wt %) | v) Bismuth-based glass frits(wt %) | Total (wt %) |
| --- | --- | --- | --- | --- | --- | --- |
| Ex. 1 | 88.8 | 1.6 | 9.3 | $Li_2WO_4$ (0.1) | 0.2 | 100.0 |
| Ex. 2 | 88.8 | 1.8 | 9.3 | $Li_2WO_4$ (0.1) | — | 100.0 |
| Ex. 3 | 88.8 | 1.6 | 9.3 | $LiMnO_3$ (0.1) | 0.2 | 100.0 |
| Ex. 4 | 88.8 | 1.6 | 9.3 | $Li_2TiO_3$ (0.1) | 0.2 | 100.0 |
| Ex. 5 | 88.8 | 1.6 | 9.3 | $Li_2MoO_4$ (0.1) | 0.2 | 100.0 |
| Co. Ex. 1 | 88.9 | 1.8 | 9.3 | — | — | 100.0 |
| Co. Ex. 2 | 88.8 | 1.8 | 9.3 | $Li_2RuO_3$ (0.1) | — | 100.0 |

EXAMPLES

The present invention is illustrated by, but is not limited to, the following examples.

The following materials are used for the examples.
Materials
i) Silver powder: spherical Ag powder with mean particle diameter (D50) of 2.0 μm
ii) Lead-tellurium-oxide powder: PbO 48.03 wt %, $TeO_2$ 51.55 wt %, $Li_2O$ 0.42 wt %)
iii) Organic medium: A: a mixture of 10 wt % binder (ethyl cellulose) and 90 wt % solvent (texanol), B: organic additives (thixotropic agents, dispersant), C: additional solvents (solvent: texanol 60 wt %, butyl carbitol 40. wt %), weight ratio of A/B/C is 30/10/60.
iv) Lithium oxide powder:
   $LiMnO_3$ powder: D50=0.42 (μm), SPA=142857 ($cm^2/cm^3$)
   $Li_2WO_4$ powder: D50=0.86 (μm), SPA=72692 ($cm^2/cm^3$)
   $Li_2TiO_3$ powder: D50=1.00 (μm), SPA=60025 ($cm^2/cm^3$)
   $Li_4Ti_5O_{12}$ powder: D50=1.00 (μm)
   $Li_2MoO_4$ powders: D50=1.24 (μm), SPA=49903 ($cm^2/cm^3$)
   $Li_2RuO_3$ powder: D50=0.80 (μm)
v) Bismuth-based glass frit: ($B_2O_3$ 8.2 wt %, $Bi_2O_3$ 73.2 wt %, $SiO_2$ 1.9 wt %, $Al_2O_3$ 0.6 wt %, ZnO 13.5 wt %, BaO 2.6 wt %)
vi) metal oxide powder: cobalt (II) oxide ($Co_3O_4$)
Experiment 1
(Procedure of Forming Electrodes)

Conductive pastes were prepared with the following procedure. Organic binders (polymers) and organic solvents were mixed in a glass vial for 48 hours at 100° C. to form an organic medium. Silver powders, lead-tellurium-oxide powders, lithium oxide powders and bismuth-based glass frits were added to the organic medium and mixed further for 5 minutes by a planetary centrifugal mixer to form The conductive paste was screen printed onto the front side of 6"×6" 80-ohm multi-crystalline Si substrates with about 70 nm of SiNx antireflective coating. The pattern consisted of 75 fingers (50 microns wide) and 2 busbars (2.0 mm wide).

On the back side of the substrate, an aluminum conductive paste was coated by screen printing and dried. The drying temperature of the pastes was 150° C. The resulting substrate was subjected to simultaneous firing of the coated pastes in an infrared furnace with a peak temperature of 750° C. and IN-OUT for about 1.5 min to obtain the desired test sample solar cell electrode.
(Electrical Measurements)

The solar cell electrodes built above was tested for efficiency (Eff (%)) using a model NCT-M-150AA cell tester manufactured by NPC Co. Xenon (Xe) arc lamp in the IV tester simulated the sunlight with 940 w/$m^2$ intensity and radiated over the formed electrode on the front surface of the cell. The tester used a four contact method to measure current (I) and voltage (V) at approximately 400 load resistance settings to determine the cell's I-V curve. Eff (%) was calculated from the I-V curve.
(Adhesion Measurements)

Adhesion of the electrode formed on the front side was measured by the following procedures. A copper ribbon coated with a Sn/Pb solder (Ulbrich Stainless Steels & Special Metals, Inc.) was dipped into a soldering flux (Kester-952s, Kester, Inc.) and then dried for five seconds in air. Half of the solder coated copper ribbon was placed on the bas electrode and soldering was done by a soldering system (SCB-160, SEMTEK Corporation Co., Ltd.). The soldering iron setting temperature was 190 to 240° C. and the actual temperature of the soldering iron at the tip was from 105° C. to 215° C. measured by K-type thermocouple.

The rest part of the copper ribbon which did not adhere to the electrode was horizontally folded and pulled at 120 mm/min by a machine (Peel Force 606, MOGRL Technology Co., Ltd.). The strength (Newton, N) at which the copper ribbon was detached was recorded as the solder adhesion.
(Results)

Figure 2:
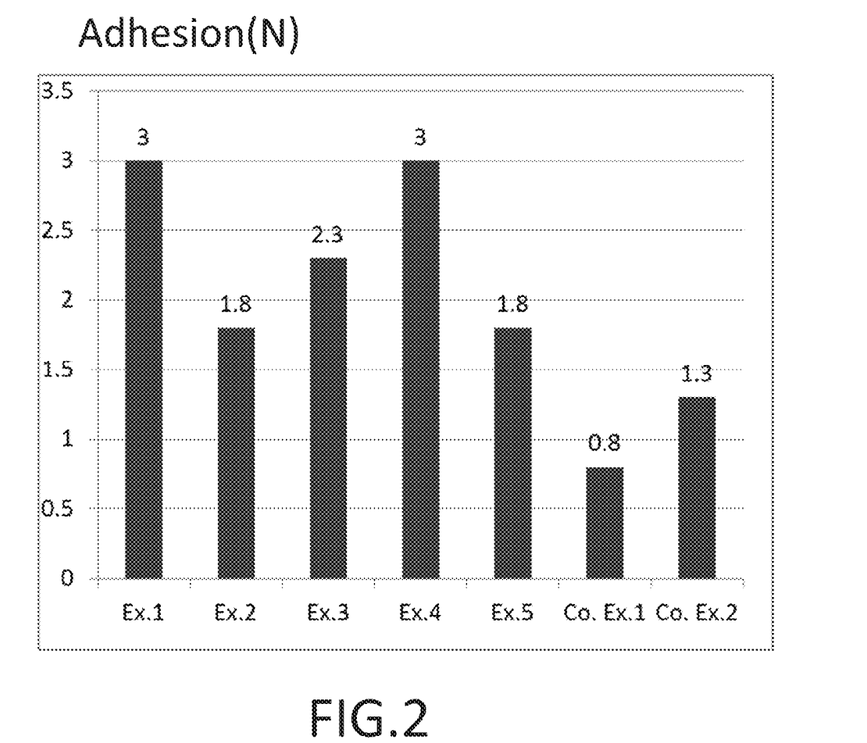
FIGS. 2-4 show the results of a measurement of adhesion (median) (N) in the Examples.

The results of the measurements were shown in Table 2 (Eff(%)) and FIG. 2 (Adhesion Measurement (N)).

TABLE 2

| Ex. No. s | Eff (%) |
| --- | --- |
| Ex. 1 | 16.6 |
| Ex. 2 | 16.6 |
| Ex. 3 | 16.5 |
| Ex. 4 | 16.5 |
| Ex. 5 | 16.6 |
| Co. Ex. 1 | 16.6 |
| Co. Ex. 2 | 16.6 |

Experiment 2
(Procedure of Forming Electrodes)

Conductive pastes were prepared as in Experiment 1. The paste compositions are shown in Table 3.

TABLE 3

| Paste composition | i) Ag powder (wt %) | ii) Lead-tellurium-oxide powder (wt %) | iii) Organic medium (wt %) | iv) Lithium oxides powder (wt %) | v) Bismuth based glass frits(wt %) | vi) Metal oxide powder (wt %) | Total (wt %) |
| --- | --- | --- | --- | --- | --- | --- | --- |
| Ex. 6 | 88.7 | 1.8 | 9.3 | $Li_2WO_4$ (0.1) | — | $Co_3O_4$ (0.1) | 100.0 |
| Ex. 7 | 88.8 | 1.8 | 9.3 | $Li_2WO_4$ (0.1) | — | — | 100.0 |

Figure 3:
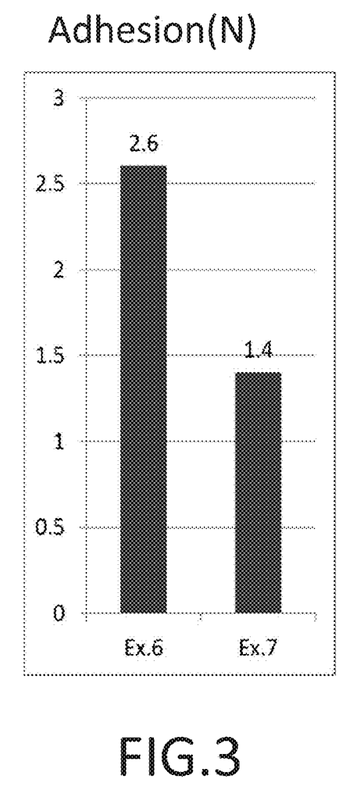

The conductive paste was screen printed onto the front side of 6"×6" 90-ohm mono-crystalline Si substrates with about 70 nm of SiNx antireflective coating. The pattern consisted of 80 fingers (65 microns wide) and 2 busbars (1.5 mm wide). On the back side of the substrate, an aluminum conductive paste was coated by screen printing and dried. The drying temperature of the pastes was 150° C. The resulting substrate was subjected to simultaneous firing of the coated pastes in an infrared furnace with a peak temperature of 750° C. and IN-OUT for about 1.5 min to obtain the desired test sample solar cell electrode. Eff(%) and Adhesion (N) were measured according to the method used in Experiment 1. The results of the measurements are shown in Table 4 (Eff(%)) and FIG. 3 (Adhesion(median) (N)).

TABLE 4

| Ex. No. s | Eff (%) |
| --- | --- |
| Ex. 6 | 17.1 |
| Ex. 7 | 17.1 |

Experiment 3
(Procedure of Forming Electrodes)

Conductive pastes were prepared as in Experiment 1. The paste compositions are shown in Table 5.

TABLE 5

| Paste composition | i) Ag powder (wt %) | ii) Lead-tellurium-oxide powder (wt %) | iii) Organic medium (wt %) | iv) Lithium oxides powder (wt %) | v) Bismuth based glass frits(wt %) | Total (wt %) |
| --- | --- | --- | --- | --- | --- | --- |
| Ex. 8 | 88.8 | 1.8 | 9.3 | $Li_2TiO_3$ (0.1) | — | 100.0 |
| Ex. 9 | 88.8 | 1.8 | 9.3 | $Li_14Ti_5O_{12}$(0.1) | — | 100.0 |

Figure 4:
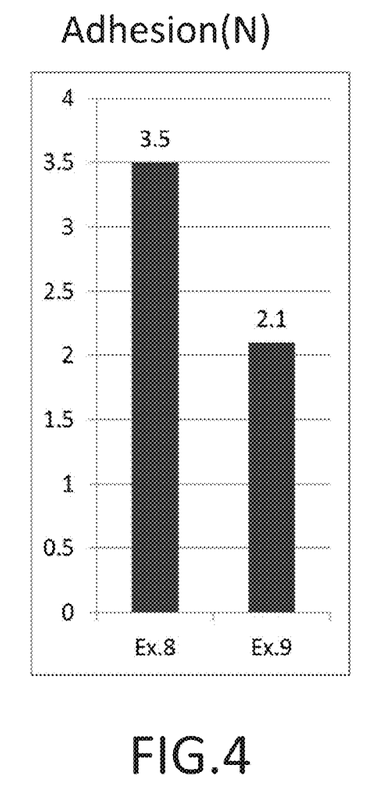

The conductive paste was screen printed onto the front side of 1"×1" 70-ohm mono-crystalline Si substrates with about 70 nm of SiNx antireflective coating. The pattern consisted of 11 fingers (100 microns wide) and 1 busbar (2.0 mm wide). On the back side of the substrate, an aluminum conductive paste was coated by screen printing and dried. The drying temperature of the pastes was 150° C. The resulting substrate was subjected to simultaneous firing of the coated pastes in an infrared furnace with a peak temperature of 750° C. and IN-OUT for about 1.5 min to obtain the desired test sample solar cell electrode. Eff(%) and Adhesion (N) were measured according to the method used in Experiment 1. The results of the measurements are shown in Table 6 (Eff(%)) and FIG. 4 (Adhesion (median) (N)).

TABLE 6

| Ex. No. s | Eff (%) |
| --- | --- |
| Ex. 8 | 15.4 |
| Ex. 9 | 15.4 |

We claim:

1. A conductive paste used for solar cell electrodes comprising,
   (i) 60 wt % to 95 wt % of a conductive powder, based on the total weight of the conductive paste,
   (ii) 0.1 wt % to 10 wt % of a lead-tellurium-oxide powder, based on the total weight of the conductive paste, comprising 20 wt % to 60 wt % of PbO and 20 wt % to 60 wt % of $TeO_2$, based on the total weight of the lead-tellurium-oxide powder,
   (iii) 3 wt % to 38 wt % of an organic medium, based on the total weight of the conductive paste,
   (iv) 0.01 wt % to 5.0 wt % of lithium oxide powder selected from the group consisting of $LiMnO_3$, $Li_2WO_4$, $Li_2TiO_3$, $Li_4Ti_5O_{12}$, $Li_2MoO_4$ and a mixture thereof, based on the total weight of the conductive paste.

2. The conductive paste of claim 1, wherein the conductive paste further comprising a bismuth-based glass frit comprising no less than 50 wt % of $Bi_2O_3$, based on the total weight of the bismuth-based glass frit.

3. The conductive paste of claim 2, wherein the bismuth-based glass frit has a weight percentage of 0.01 wt % to 1.0 wt %, based on the total weight of the conductive paste.

4. The conductive paste of claim 2, wherein the bismuth-based glass frit further comprises ZnO, $B_2O_3$ or a mixture thereof.

5. The conductive paste of claim 1, further comprising a metal resinate selected from the group consisting of lead resinate, barium resinate, calcium resinate, bismuth resinate, manganese resinate and a mixture thereof.

6. The conductive paste of claim 1, further comprising a metal oxide powder selected from the group consisting of cobalt(II) oxide, zinc oxide, magnesium oxide, chromium oxide, copper(II) oxide, Iron(III) oxide and a mixture thereof.

7. The conductive paste of claim 1, wherein the mean particle size (D50) of the lithium oxide powder is 0.1 µm to 5.0 µm.

8. The conductive paste of claim 1, wherein the specific surface area (SPA) of the lithium oxide powder is in the range of 10000 to 150000 $cm^2/cm^3$.

* * * * *